United States Patent [19]
Talbot

[11] Patent Number: 5,959,458
[45] Date of Patent: Sep. 28, 1999

[54] METHOD AND APPARATUS FOR MEASURING ELECTRICAL WAVEFORMS USING ATOMIC FORCE MICROSCOPY

[75] Inventor: Christopher Graham Talbot, Menlo Park, Calif.

[73] Assignee: Schlumberger Technologies, Inc., San Jose, Calif.

[21] Appl. No.: 08/745,885

[22] Filed: Nov. 8, 1996

[51] Int. Cl.⁶ .......................... G01R 31/302; G01B 5/28
[52] U.S. Cl. .......................... 324/750; 250/306
[58] Field of Search .................... 324/750, 751; 250/306, 307, 310, 311

[56] References Cited

U.S. PATENT DOCUMENTS

| | | | |
|---|---|---|---|
| 4,724,318 | 2/1988 | Binnig | 250/306 |
| 5,144,225 | 9/1992 | Talbot et al. | 324/73.1 |
| 5,381,101 | 1/1995 | Bloom et al. | 324/676 |
| 5,442,300 | 8/1995 | Nees et al. | 324/762 |
| 5,465,046 | 11/1995 | Campbell et al. | 324/244 |
| 5,488,305 | 1/1996 | Bloom et al. | 324/537 |
| 5,550,479 | 8/1996 | Wakana et al. | 324/750 |

OTHER PUBLICATIONS

Francis Ho, *Applications of Scanning Force Microscopy for Voltage Measurements with High Spatial and Temporal Resolutions*, PhD Dissertation, Stanford University, Feb. 1995.

*Primary Examiner*—Josie Ballato
*Assistant Examiner*—Russell M. Kobert
*Attorney, Agent, or Firm*—Danita J.M. Maseles

[57] ABSTRACT

Sampling a waveform in an IC device to which a repeating test pattern is applied, includes the steps of: a) defining a portion of the test signal containing a feature of interest; b) applying a sampling signal to an AFM device adjacent a surface of the IC device at a predetermined point during the portion for a series of consecutive repetitions of the test signal pattern, the sampling signal having substantially shorter duration than the feature of interest; c) measuring deflection of a cantilever in the AFM device on application of the sampling signal; and d) determining the voltage at the predetermined point from the measured deflection of the cantilever. The steps can be applied at several points in the portion of interest and the measurements integrated and displayed.

19 Claims, 3 Drawing Sheets

METHOD AND APPARATUS FOR MEASURING ELECTRICAL WAVEFORMS USING ATOMIC FORCE MICROSCOPY

FIELD OF THE INVENTION

The present invention provides a technique by which measurements can be made of electrical waveforms in IC devices using atomic force microscopy to sample the waveform at a given location in the IC.

BACKGROUND OF THE INVENTION

The use of atomic force microscopy to measure periodic electrical waveforms has been proposed previously in U.S. Pat. Nos. 5,381,101 and 5,488,305. The '101 and '305 patents (incorporated herein by reference) describe a system which can be used to make such measurements. This system is shown in FIG. 1 and comprises a system controller 10 connected to a conventional X-Y stage 12 and cantilever position detection optics 14. The controller 10 is typically implemented using a microprocessor or dedicated computer capable of supplying position control information to the X-Y stage 12. The stage 12 translates the IC sample under test (DUT) 16 to a desired position relative to a cantilevered tip 18 of a commercially available scanning probe microscope. The tip 18 is coupled to a cantilever 20 which can be displaced by the electric field between the tip 18 and the sample 16. The tip can be made of a conductive material such as aluminum or can be coated in a conductive material. Alternatively, the tip 18 can be formed integrally with the cantilever 20. Detection optics 14 provide a detection signal indicative of the displacement of the tip 18 relative to the surface of the sample 16. The detection optics 14 include a laser source 24 for illuminating the cantilever 20 with a focused optical beam. A portion of this beam is reflected by the cantilever and impinges on a conventional position detector 26. The resulting signal generated by the detector 26 can then be used to display the waveform.

In use, a repetitive test signal is applied to the DUT and appears as a periodic electrical waveform having a repetition frequency f at the surface of the DUT. A pulse generator 28 is used to apply a sampling signal to the cantilever and tip. The sampling signal is chosen to have a frequency which is offset from the repetition frequency f by a difference frequency $\Delta f$, the difference frequency being chosen to be less than the mechanical response frequency of the cantilever, i.e. the sampling signal has a frequency of $f+\Delta f$. The voltage across the gap between the tip and the DUT due to the periodic sample waveform and the sampling signal causes deflection of the cantilever which acts as a mechanical mixer in this mode and allows the waveform to be sampled and displayed by detecting the deflection of the cantilever.

FIG. 2 shows the signals involved in operation of this prior art system plotted in the time domain. The periodic waveform Vs has a frequency f (period 1/f). The sampling signal Vp has a frequency of $f+\Delta f$ (period $1/(f+\Delta f)$). Consequently, the sampling signal Vp progressively samples through the periodic waveform Vs, the tip deflection at each sampling point being indicative of the voltage in the periodic waveform at that point. This deflection is displayed directly on an oscilloscope as a time expanded waveform TE.

While the prior art approach is relatively easy to implement and the cantilever displacement directly provides the time expanded waveform which can be displayed on an oscilloscope, it is relatively inflexible when signals of arbitrary frequency are to be sampled and has poor noise performance since it is unable to average signals on a per point basis. Also, the use of a mixing frequency means that it is only possible to sample a complete waveform. Where an IC test pattern is very long, it is often desirable to sample only a part of the waveform in which a feature of interest is known to occur.

A variation on this prior art process is described in the PhD dissertation "Applications of Scanning Force Microscopy for Voltage Measurements with High Spatial and Temporal Resolutions" by Francis Ho, Stanford University, 1995. In this case, a portion of the waveform only is sampled. The sampling signal is not applied until the beginning of the portion of interest and is then swept through the portion on successive repetitions in the same manner as before. In one form, a single sweep is performed, in another, several sweeps are performed and the results integrated to improve signal to noise ratio. Other prior art techniques available to AFM measurements are sampling using Golay codes and sampling in a vacuum.

It is an object of the present invention to provide a method and apparatus which allows improved waveform sampling using atomic force microscopy.

SUMMARY OF THE INVENTION

One aspect of the present invention provides a method of sampling a waveform in an IC device to which a repeating test pattern is applied, comprising: a) defining a portion of the test signal containing a feature of interest; b) applying a sampling signal to an AFM device adjacent a surface of the IC device at a predetermined point during the portion for a series of consecutive repetitions of the test signal pattern, the sampling signal having substantially shorter duration than the feature of interest; c) measuring deflection of a cantilever in the AFM device on application of the sampling signal; and d) determining the voltage at the predetermined point from the measured deflection of the cantilever.

Another aspect of the invention provides Apparatus for measuring a waveform in an IC device to which a repeating test signal pattern is applied, comprising: (a) an atomic force microscope (AFM) device including a cantilever, which is positionable adjacent a surface of the IC device; (b) a sampling signal generator which generates a sampling signal and applies it to the AFM device at a predetermined point during a predetermined portion of the test signal including a feature of interest for a series of consecutive repetitions of the test signal pattern, the sampling signal having substantially shorter duration than the feature of interest; (c) a cantilever deflection sensor which detects deflection of the cantilever on application of the sampling signal; and (d) an analyzer which analyzes the deflection of the cantilever and determines the voltage in the waveform at that point.

In a typical arrangement, the total length of the test signal pattern will be relatively long compared to the feature of interest in the pattern which itself will include some structure. Therefore it is necessary that the sampling signal be of shorter duration than the feature of interest and of significantly shorter duration than the test signal pattern. For example, a test signal pattern might have a duration of 5 $\mu s$, the feature of interest might lie in a window of 100 ns and the sampling signal might have a duration of 1 ns. By appropriate use of time delay from the beginning of the test signal pattern, the sampling signal can be applied at any point therein and the pattern can be sampled over a part of its duration by varying the time delay applied to the sampling signal by a predetermined time interval or multiples thereof.

DESCRIPTION OF THE PREFERRED EMBODIMENT

Figure 1:
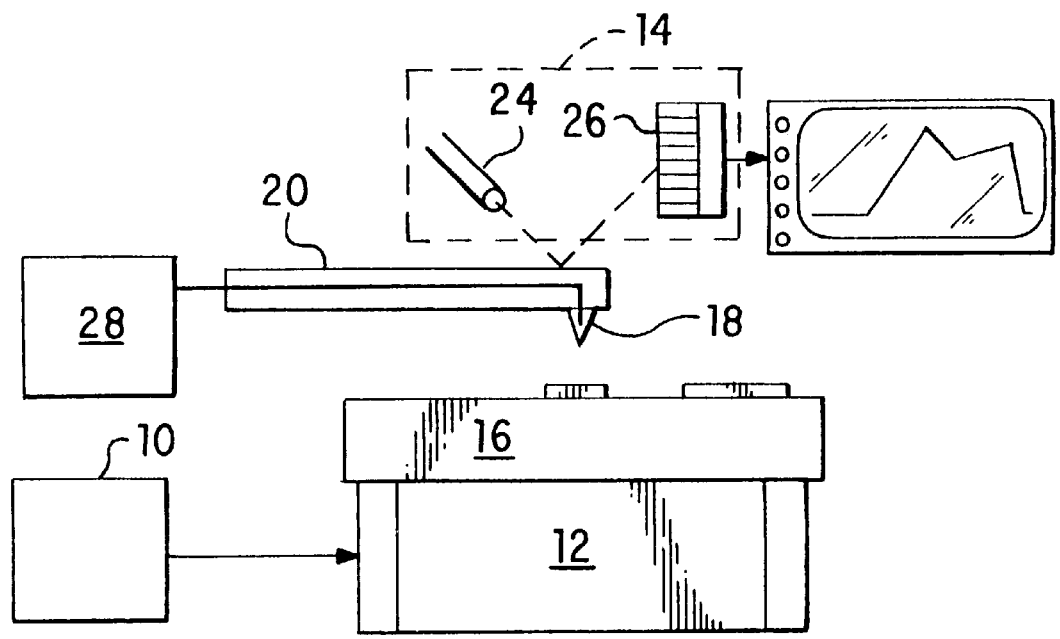
FIG. 1 shows a schematic view of a prior art waveform measurement system.
Figure 2:
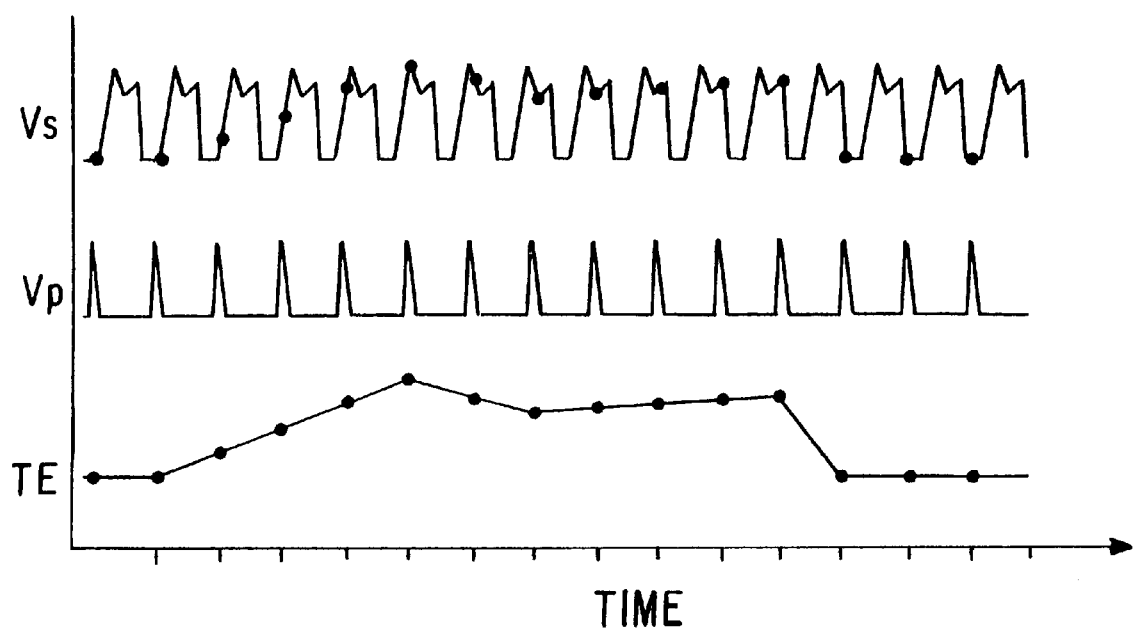
FIG. 2 shows plots of waveform, sampling signal and tip deflection magnitude V in the time domain T.
Figure 3:
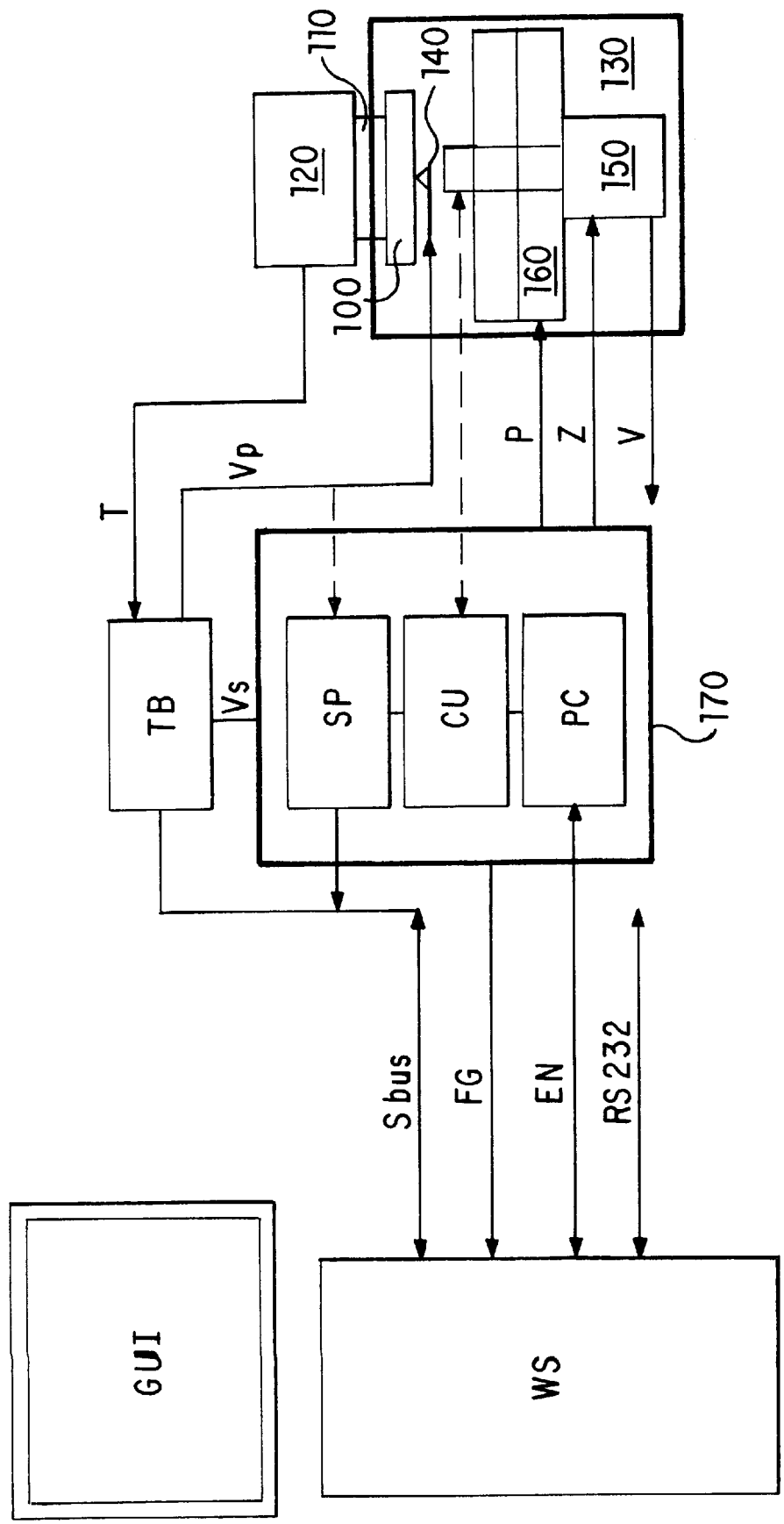
FIG. 3 shows a schematic view of a system according to the present invention.

FIG. 3 shows a system according to the present invention. The DUT 100 is placed in a test head 110 which is connected to a device tester 120 (such as the ITS 9000 GX available from Schlumberger Technologies, Inc. of San Jose). The tester 120 provides a repeating test signal pattern to the DUT 100 which appear as waveforms Vs at the surface of the DUT and which are measured in accordance with the present invention. The test head 110 is located in a chamber 130, in the manner of a conventional electron beam tester, together with a cantilevered probe device 140 (such as the Autoprobe microscope made by Park Scientific Instruments) including a cantilever deflection sensor, a CCD camera 150 mounted on a coarse X-Y stage 160 provided with a zoom capability so as to be able to image the DUT 100 and probe device 140. An AFM subsystem 170 controls operation of the probe device 140 and camera 160. The subsystem comprises a computer PC which is interfaced with and AFM control unit CU, a signal processing unit SP and a timebase unit TB. The subsystem provides pan P and zoom Z controls to the camera 160 and receives video output V from the camera. The timebase unit TB receives trigger signals T (e.g. a time reference signal at the beginning of each pattern) from the tester 120 and provides trigger and pulser signals Vp to the probe device 150 and to the signal processing unit SP which also receives the signals indicative of cantilever deflection (and hence the waveform voltage at the sample point) Vs from the probe device 150. A workstation WS is provided to allow the user to control the system and display and analyze the measurements. An example of a suitable workstation would be one made by Sun Microsystems running the Unix operating system and having a graphic user interface GUI. The workstation could display timebase and waveform data via Sbus from the timebase unit and signal processing unit, video via Frame grabber FG and allows user level control of the AFM subsystem via an Ethernet link EN to the computer and pan and zoom control via an RS 232 serial interface. The workstation can also provide and display CAD data relating to the design of the DUT to assist in positioning the probe device 150 so as to allow reliable measurement of waveforms on particular traces in the DUT.

The present invention is distinguished from the prior art system in that instead of applying a sampling signal with a frequency of f+Δf, a short duration sampling signal is applied at a predetermined time delay from the beginning of the test pattern. Thus the sampling signal can sample the same point in the pattern over a number of repetitions and, in order to sample the whole region of feature of interest in the pattern, a time increment Δt is introduced from time to time to vary the position of the sampling signal in the pattern. A set time increment can be introduced so as to progressively advance the sampling signal through the feature of interest. Alternatively, the time increment can be a variable and random multiple of a given time offset so as to provide effectively random or non-sequential sampling of the feature of interest. This approach has the advantage of reducing surface charging and so minimizes errors in the voltage measurement due to this effect. This approach to sampling waveforms has been previously applied to the sampling of waveforms using electron beam testers and is described in more detail in U.S. patent application Ser. No. 08/488,650, now U.S. Pat. No. 5,638,005 (incorporated herein by reference). When implemented using an AFM, it is necessary to allow the cantilever to stabilize between measurements to avoid errors.

The cantilever of the AFM device has a time response which is relatively long compared to the duration of the signals in the test. In order that the time response of the cantilever should not unduly influence the response of the tester, changes in the time delay should not be made at periods of less than the response time of the cantilever. Thus for each time delay, it would be normal to make several sampling signal measurements.

Figure 4:
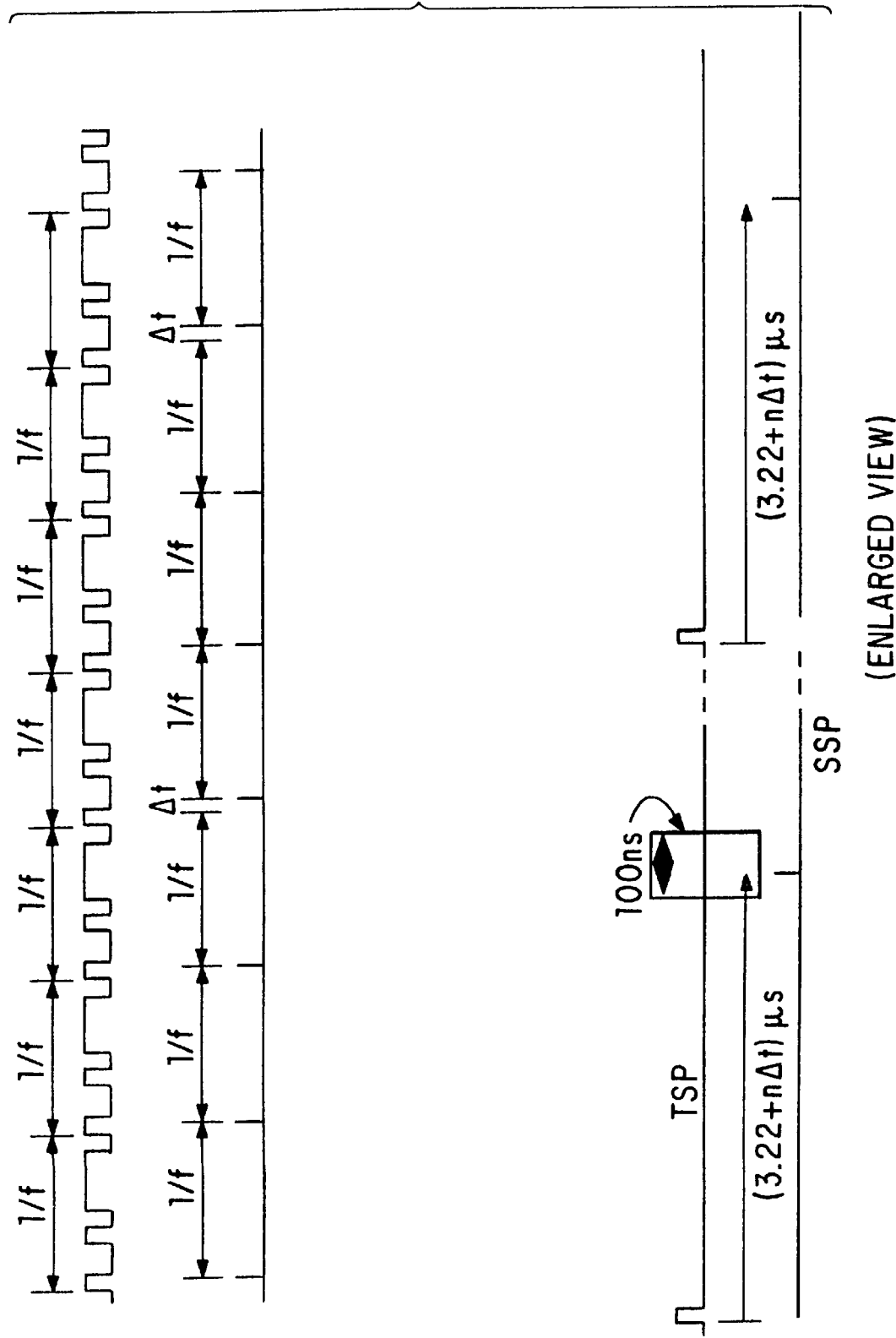
FIG. 4 shows the disposition of waveform and sampling signals in the time domain in a method according to the present invention.

A specific example of the implementation of the present invention is schematically shown in FIG. 4 and given in the table below:

| | |
|---|---|
| Test Signal Pattern Repetition Period (1/f) | 5 μs |
| Delay to start of sampling window | 3.22 μs |
| Complete time duration of window | 100 ns (3.22–3.23 μs) |
| Sampling signal pulse width | 1 ns (1/10 of a time division) |
| Sampling signal pulses per point | 10–100 pulses |
| Time increment between points (Δt) | 200 ps |
| Waveform display scale | 10 ns/div, 10 divisions, 500 sample points |

It will be appreciated that by sampling each point 10–100 times for a given time delay, the sampling signal is applied at the same frequency as the repetition frequency of the test signal pattern. This is to be contrasted with the mixing frequency approach of the prior art technique.

I claim:

1. A method of sampling a waveform in an IC device to which a repeating test pattern is applied using an AFM device having a cantilever and a probe tip, the method comprising:

a) defining a portion of the test signal containing a feature of interest having a predetermined duration;

b) applying a sampling signal to the cantilever of the AFM device which is positioned such that the probe tip is adjacent a surface of the IC device at a predetermined point in time during the portion for a series of consecutive repetitions of the test signal pattern, the sampling signal having a duration which is substantially shorter than the predetermined duration of feature of interest;

c) measuring deflection of the cantilever in the AFM device on application of the sampling signal; and d) determining the voltage at the predetermined point in time of the feature of interest from the measured deflection of the cantilever.

2. A method as claimed in claim 1, further comprising repeating steps b), c) and d) for other predetermined points in the portion of the test signal during further series of repetitions.

3. A method as claimed in claim 2, wherein the points are separated by a predetermined time interval.

4. A method as claimed in claim 3, comprising advancing the point by the time interval for each consecutive series of repetitions.

5. A method as claimed in claim 3, comprising changing the point by non-sequential multiples of the time interval for each consecutive series of repetitions.

6. A method as claimed in claim 3, wherein the sampling signal has a pulse width of the order of 1 ns and the time interval is of the order of 200 ps.

7. A method as claimed in claim 1, wherein each series contains about 10 to 100 repetitions of the test signal.

8. A method as claimed in claim 1, further comprising integrating the multiple voltage determinations for each point and displaying the resulting integrated voltage.

9. A method of sampling a waveform in an IC device to which a repeating test pattern is applied using an AFM device having a cantilever and a probe tip, as claimed in claim 1, the method further comprising:

(i) after the step of defining a portion of the test signal containing a feature of interest having a predetermined duration, then defining a series of regular spaced, predetermined points in time in the portion of the test signal, the predetermined points being spaced apart by a predetermined time interval; and (ii) after determining the voltage at the predetermined point in time of the feature of interest from the measured deflection of the cantilever, then repeating steps b)–d) for other predetermined points in time so as to perform a series of applications, the points in time being addressed in a non-sequential fashion.

10. Apparatus for measuring a waveform in an IC device to which a repeating test signal pattern is applied, comprising:

(a) an atomic force microscope (AFM) device including a cantilever having a probe tip which is positionable adjacent a surface of the IC device;

(b) a sampling signal generator which generates a sampling signal and applies it to the cantilever at a predetermined point in time during a predetermined portion of the test signal including a feature of interest of predetermined duration for a series of consecutive repetitions of the test signal pattern, the sampling signal having a duration which is substantially shorter than the predetermined duration of the feature of interest;

(c) a cantilever deflection sensor which detects deflection of the cantilever on application of the sampling signal; and (d) an analyzer which analyzes the deflection of the cantilever and determines the voltage in the waveform at that point.

11. Apparatus as claimed in claim 10, wherein the sampling signal generator applies the sampling signal at different points during further series of repetitions of the test signal.

12. Apparatus as claimed in claim 11, wherein the different points are separated by a predetermined time interval.

13. Apparatus as claimed in claim 12, wherein the sampling signal has a duration of about 1 ns and the time interval is of the order of 200 ps.

14. Apparatus as claimed in claim 11, wherein the sampling signal generator advances the point by one time interval for consecutive series of repetitions of the test pattern.

15. Apparatus as claimed in claim 11, wherein the sampling signal generator varies the point by non-consecutive multiples of the time interval.

16. Apparatus as claimed in claim 11, wherein the sampling signal generator applies the sampling signal for about 10 to 100 repetitions of the test signal in each series.

17. Apparatus as claimed in claim 10, further comprising a trigger signal detector for detecting a signal at the beginning of the test signal pattern.

18. Apparatus as claimed in claim 10, further comprising a camera for imaging the IC device and the AFM device together so as to allow positioning of the AFM device at a predetermined location on the IC device.

19. Apparatus as claimed in claim 10, further comprising a display unit for displaying voltage, waveform and signal data.

* * * * *